Dec. 5, 1967 J. C. LINN 3,356,905

AXIAL CONDUCTOR LOCATOR

Filed Nov. 29, 1966

INVENTOR.
JOSEPH C. LINN

BY

ATTORNEY 3,356,905

AXIAL CONDUCTOR LOCATOR

Joseph C. Linn, Westwood, N.J., assignor to The Bendix Corporation, a corporation of Delaware Filed Nov. 29, 1966, Ser. No. 597,782
11 Claims. (Cl. 317—101)

ABSTRACT OF THE DISCLOSURE

This invention relates to an electrical circuit apparatus and more particularly to an electrical connector for mechanically and electrically interconnecting circuit decks, interfaces or printed circuit boards carrying electrical components.

When interconnecting numerous electrical circuit boards, decks or interfaces, it is necessary to maintain a physical relationship with the conductors on the circuit boards so that no stress or strain is caused on the conductors by movement of the circuit boards with respect to each other. This invention utilizes a shaft hinge to permit rotational movement and mechanical support of circuit boards mounted thereon. The shaft hinge also functions as a magnetic shield and an electrical conductor.

BACKGROUND

*Field of the invention*

The field of this invention pertains to an interconnector between electrical circuit boards or wiring decks employing a support shaft hinge.

*Description of the prior art*

The prior art displays the need for conserving space where circuit boards or wire decks are interconnected electrically on the boards. Such assemblies concurrently require accessibility to the surfaces of the circuit boards for repair and calibration operations. Various types of mechanical clamps and hinge structures are used to meet this requirement, see U.S. Patent No. 2,740,097, granted Mar. 27, 1956, to A. P. Edelman et al. and U.S. Patent No. 3,048,806, granted Aug. 7, 1962, to G. R. Heidler. The present invention allows multiple circuit board support on a common hinge, and longitudinal conductor insertion through the hinge. The hinge serves as a coaxial shield to the longitudinally inserted conductors and as a common ground for the electronic circuitry on the boards.

A solution of the problem of compactness and serviceability has been sought by an electrical connector hinge disclosed in a U.S. Patent No. 3,199,059, granted Aug. 3, 1965, to M. S. Masse et al. and assigned to The Bendix Corporation, assignee of the present invention. In the latter patent there is utilized a mechanical shaft hinge means made of insulating material, which structure also requires numerous ring members 15 and 16, as shown by FIGURE 1 of the patent, to electrically connect the circuit boards. Thus numerous solder connections are required on the ring members at points 24 where the conductors from the circuit boards meet the ring members. Furthermore, the support shaft of the Masse patent may not be used as an electromagnetic shield or common ground, since the shaft is made of an insulating material and, by virtue of the ring structure, requires end bolts at the ends of the shaft to compress the conductive ring member of one circuit board to the conductive ring member of another board. Thus such ring members serve as the mechanical supports of the boards and the electrical interconnections between the boards.

The present invention employs a hollow hinge shaft made of metal which supports the circuit boards. Further, electrical conductors may be longitudinally inserted through the shaft hinge which acts as a magnetic shield to prevent any current from being induced in circuit elements on or external to the axial conductor shaft hinge. Conductors electrically interconnecting one circuit board with another are tied by suitable tie clamp means on to the shaft hinge and held in place by a harness arrangement. Thus solder processes required in the case of the ring members 15 and 16 of the Masse et al. patent are effectively eliminated in the present invention which further provides for minimizing conductor length, bulk and weight in the electrical interconnectors. Thus the novel shaft hinge serves multiple mechanical and electrical functions.

SUMMARY OF THE INVENTION

This invention contemplates a circuit board apparatus for interconnecting circuit boards with electrical circuits thereon by means of a shaft hinge which is longitudinally inserted through shoulder hinges of the circuit board for mechanical support of the circuit boards and means to attach electrical conductors to the shaft and within it together with means for mounting conducting and nonconducting elements thereon.

A further object within the contemplation of this invention is to provide a rigid shaft hinge means between circuit boards or wiring decks having electrical components thereon in a compact assembly while allowing the boards to be rotated about a common axis for repair and calibration operations.

Another object of the invention is to provide a rigid hinge interconnector to which conductors between different circuit boards are attached to the outer periphery of the hinge thereby eliminating soldering connections between respective circuit boards.

Another object of the invention is to provide a new and improved means of interconnecting circuit boards or wiring decks to allow folding and rotation of the wiring decks with respect to each other without any stress on the electrical conductors between the boards or on the electrical terminals on the boards.

A further object of the present invention is to provide an electrically conductive hinge structure which can serve as a coaxial shield to electrical conductors inserted therethrough and as a common ground connection for the electrical system, and as a structure to attach mounting elements thereto.

These and other objects and features of the invention are pointed out in the following description in terms of the embodiment thereof which is shown in the accompanying drawings. It is to be understood, however, that the drawings are for the purpose of illustration only and are not a definition of the limits of the invention, reference being had to the appended claims for this purpose.

DESCRIPTION OF THE DRAWINGS

In the drawings corresponding numerals indicate corresponding parts in the respective views.

DESCRIPTION OF THE INVENTION

Figure 1:
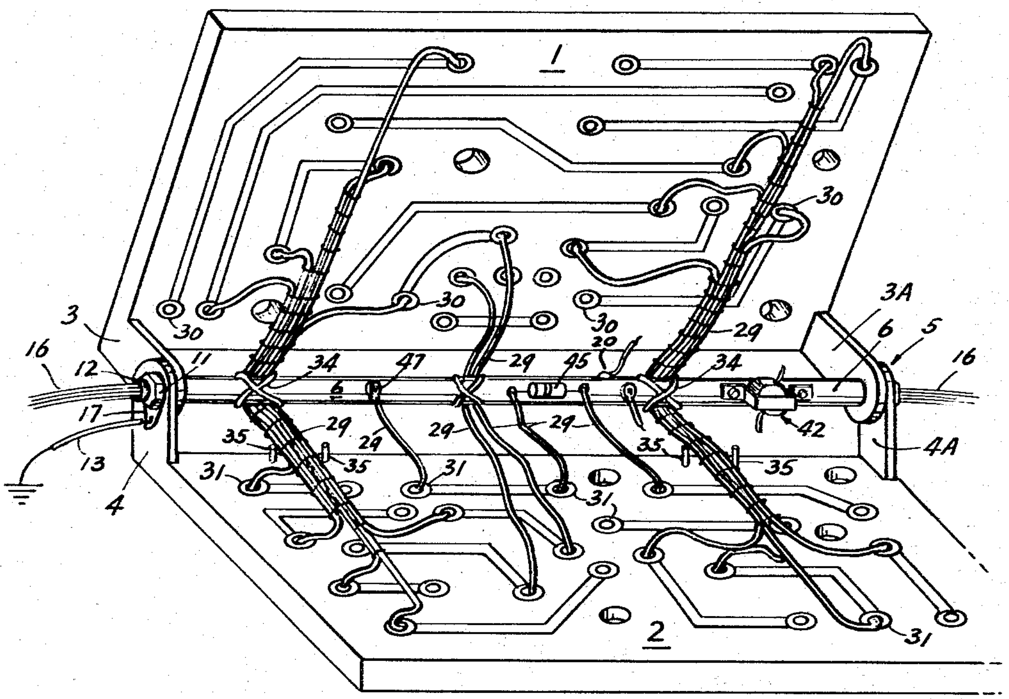
FIGURE 1 is a perspective view of two circuit boards interconected by a hinge shaft arrangement embodying the present invention.

Referring to the drawing of FIGURE 1, there is illustrated two circuit decks, interfaces or printed circuit boards 1 and 2 formed of a suitable plastic electrical insulating or dielectric material such as Bakelite or the like. The circuit boards 1 and 2 are of a type having a plurality of generally parallel conductive strips of an electrical circuit or network etched on the surface of the flat boards, decks or interfaces 1 and 2 which are interconected by a hinge structure 5.

The circuit board 1 has shoulder hinge portions 3 and 3A formed integral with the board 1 of the electrical insulating material while the circuit board 2 has shoulder hinge portions 4 and 4A formed integral with the board 2 and of the electrical insulating material. The hinge structure 5 includes an axial conductor hinge shaft locator 6 of a rigid hollow conducting material. The external surface of the hinge shaft 6 has threads 10 at opposite ends of the hinge shaft 6. The inner surface of the hinge shaft 6 has internal screw threads provided therein at the opposite ends of the hinge shaft 6 as at 9.

In assembling the interconnecting circuit boards with the hinge shaft 6, the hinge shaft 6 is inserted through shoulder hinges 3A and 4A of the circuit boards 1 and 2 and sliding shoulder hinges 3A and 4A part way along hinge shaft 6 thus allowing insertion of the hinge shaft 6 through shoulder hinges 3 and 4 and sliding shoulder hinges 3 and 3A and 4 and 4A of circuit boards 1 and 2 in the opposite directions for proper centering. Locknuts 11 having internal screw threads are screw threadedly engaged on both of the outer screw threaded ends 10 of the hinge shaft locator 6 so as to secure the hinge shaft 6 between the shoulder hinges 4 and 4A and the circuit boards 1 and 2 on the hinge shaft locator 6. Grommets 12 having external screw threads are arranged in screw threaded engagement with the internal screw threads 9 provided in the hollow hinge shaft 6 and serve to support therein the electrically insulated wires 16 extending longitudinally within the hinge shaft 6.

A ground lug 17 may be inserted on the hinge shaft 6 and held in place by one of the locknuts 11 to ground the hinge shaft 6 through a conductor 13 spot soldered to the lug 17 and connected to ground as indicated in FIGURE 1. Spot solder connection 20 may also ground the hinge shaft 6 by a wire 21 connected to ground.

Interconnecting electrical conductors 29, which may be formed of a suitable flexible wire, may lead between various terminal points 30 and 31 of circuit boards 1 and 2. The conductors 29 have a suitable electrical insulating coating and are attached to the hinge shaft 6 by means of tie lines or clamps 34 formed of suitable plastic electrical insulating material and tied about the conductors 29 and hinge shaft 6. It is contemplated that a number of structures using the hinge shaft 6 axially located between numerous multiple circuit boards will be utilized side by side. Interconnection between multiple nonadjacent units without causing conglomerated bulk wiring is provided by the hollow structure of hinge shaft 6.

Thus wires 16 from external units or sources of electrical energy may be inserted longitudinally through a channel or the hollow interior of the hinge shaft 6 from one end of the shaft 6 and out the other end thereof. The hinge shaft 6 may be formed of an electrically conductive ferro magnetic material so as to provide an electromagnetic induction shield especially effective at high frequencies.

The invention contemplates permanent affixation of the wires 16 within the shaft hinge 6 by means of the grommets 12 provided in the opposite ends of the hinge structure 5.

Interconnecting the circuit boards by tying the flexible conductors 29 to the hinge shaft 6 by the tie lines or clamps 34 allows direct connection from one circuit board to another with only one conductor. The invention thus allows the use of short conductors and minimum terminal connections and soldering points. The clamping of the interconnecting conductors 29 by the tie clamps 34 to the hinge shaft 6 allows simple replacement of the interconnecting conductors 29. These electrical interconnecting conductors 29 are positioned lengthwise along the conductor hinge 6 and clamped or tied to the hinge shaft 6 by the tie lines or clamps 34. This expedient allows the hinge shaft 6 to serve as the axial support for the circuit boards and prevents conductor stress, push or pull on various circuit board terminals 30 and 31 as the circuit boards 1 and 2 are moved or rotated on the shaft hinge 6.

The relationship existing by virtue of one interconnection from one terminal 31 on a board 2 to another terminal 30 on board 1 is such that conductor length is minimum resulting in reduced bulk and weight of the structure, reduced cost and improved electrical characteristics. Further, nails 35 project from the respective boards 1 and 2 adjacent the flexible conductors 29 and the hinge structure 5 serves to so locate the flexible conductors 29 with respect to the tie clamps 34 as to provide a minimum conductor length.

The shoulder hinges 4 and 4A of circuit board 2 are located axially in an adjacent relation with the respective shoulder hinges 3 and 3A of circuit board 1 with the shoulder hinges 3 and 3A being arranged in a spaced relation on the board 1 and adjacent to the shoulder hinges 4 and 4A of the board 2. This arrangement is followed in permitting additional circuit boards to be added on the hinge shaft 6. Thus a replacement of a circuit board 1, for example, is done by taking out the hinge shaft 6 and removing the particular circuit board. The present invention therefore provides an improved hinge structure for supporting circuit boards that can be rotated about the hinge shaft 6 for repairs and calibration and which allows electrical conductor interconnections between the circuit boards. The invention utilizes the metal hinge structure to provide an electrical connection to ground and to allow insertion of electrical conductors longitudinally through the hinge structure.

Figure 2:
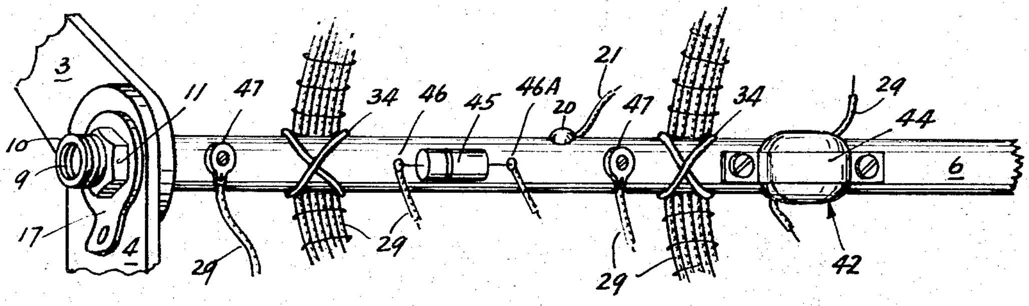
FIGURE 2 is an enlarged front view of the support shaft locator hinge with typical mountings on the hinge.

Referring to FIGURE 2, which is an enlarged view of the axial conductor hinge shaft locator serving as the hinge shaft 6 between circuit boards 1 and 2, it is seen that the hinge shaft conductor locator 6 made of a conducting material can serve a number of functions. Besides the shielding effect thereby preventing electromagnetic induction produced by current in the conductors 16 extending longitudinally through the hinge shaft 6, the hinge shaft 6 also serves as a common ground and as a mounting device for other electrical or mechanical components.

The tie clamps 34 secure the interconnecting conductors 29 to the hinge shaft 6, as shown in FIGURE 2. Longitudinal sliding is prohibited, and predetermined positioning of the conductors 29 is maintained on the hinge shaft 6. The outside surface of the hinge shaft 6 may act as a common ground by attaching ground lug 17 on the hinge shaft 6 with a wire 13 being connected to ground. If preferred, the solder connection 20 may be connected by wire 21 to ground.

An electrical component such as a small transformer 42 may be attached to the electrically conducting hinge shaft 6 by a tie strap or tie clamp means 44 so as to be conductive or nonconductive with the hinge shaft 6. In the latter arrangement there would be required suitable insulation between the transformer 42, the mounting tie strap or tie clamp means 44, and the hinge shaft 6 or that the tie strap or tie clamp means 44 be formed of a suitable electrical insulating material. Opposite terminals of the transformer 42 may be connected to conductors 29 leading from the circuit board terminals 30 and 31.

Similarly, electrical components such as a resistor 45 may be connected in the electrical network by wires 29 from terminals 31 of the circuit board 2. The terminals of the resistor 45 may be mounted on and insulated from the hinge shaft 6 by suitable insulating material 46 and 46A embedded in the hollow shaft hinge 6. Mounted contact 47 allows the electrical network on the boards to be grounded by a suitable electrical conductor 29 leading thereto, as shown by FIGURE 1. Symbolization may also be added to the hinge shaft locator 6 for identifying the interconnecting conductors 29 between the multiple circuits or electrical networks on the circuit boards 1 and 2.

Although only one embodiment of the invention has been illustrated and described, various changes in the form and relative arrangements of the parts, which will now appear to those skilled in the art may be made without departing from the scope of the invention. Reference is, therefore, to be had to the appended claims for a definition of the limits of the invention.

What is claimed is:

1. A circuit board apparatus of a type including a plurality of boards of a dielectric material having conductive strips of an electrical network provided thereon; wherein the improvement comprises each of said boards having shoulder hinges of said dielectric material projecting from and formed integral with the boards, an elongated support shaft hinge, said support shaft hinge extending through the shoulder hinges, conductors electrically interconnecting the conductive strips on said boards, and tie clamp means for attaching the conductors to the support shaft hinge.

2. The improvement defined by claim 1 including pins projecting from each of said boards for locating the conductors in relation to said tie clamps so that the conductors may be provided of a minimum length.

3. The improvement defined by claim 1 including means for attaching an electrical component to the support shaft hinge, and an electrical conductor leading from a conductive strip of at least one of said boards to said electrical component.

4. The improvement defined by claim 1 in which the tie clamp means includes tie lines of an electrical insulating material tied about said interconnecting electrical conductors and the hinge shaft so as to attach the interconnecting electrical conductors to the hinge shaft.

5. The improvement defined by claim 1 in which the tie clamp means includes an electrical component and means for attaching the electrical component to the support shaft hinge, and at least one of said electrical conductors leading from a conductive strip of at least one of said boards to said electrical component.

6. The improvement defined by claim 1 in which the tie clamp means includes an electrical device and a fastening strap for attaching the electrical device to the support shaft hinge, and electrical conductors leading from conductive strips on said boards to said electrical component.

7. The improvement defined by claim 1 including said support shaft hinge being of an electrically conductive material and having an inner surface and an outer surface, the outer surface of said shaft defining a periphery of the support shaft hinge and the inner surface defining a longitudinally extending channel within the support shaft hinge, electrical conductors extending longitudinally through the channel in said support shaft hinge, means for electrically grounding the support shaft hinge so that said support shaft hinge provides an electromagnetic shield to the electrical conductors extending therethrough.

8. The improvement defined by claim 6 in which the support shaft hinge includes external screw threads provided on the outer peripheral surface thereof, internal screw threaded locknut means cooperating in screw threaded engagement with the external screw threads on the support shaft hinge for securing the support shaft hinge between the shoulder hinges projecting from one of said boards, the support shaft hinge including internal screw threads provided in the inner surface of the hinge shaft, grommets for supporting the electrical conductors extending longitudinally in said support shaft, and said grommets having external screw threads in screw threaded engagement in the internal screw threads provided in the inner surface of the hinge shaft for securing the last mentioned electrical conductors within said support shaft.

9. The improvement defined by claim 1 including said support shaft hinge being of an electrically conductive material, an electrical device of a first type mounted on the hinge shaft and conductively attached to the hinge shaft, an electrical device of a second type, electrical insulating means to attach the electrical device of the second type to the hinge shaft, the electrical device of the first type including an electrically conductive lug for connecting the support hinge shaft to ground, contact means mounted on the shaft for electrically connecting at least one of the electrical conductors to the support shaft hinge, and the electrical device of the second type including an electrical component connected to at least one of said electrical conductors.

10. The improvement defined by claim 7 including an electrical device of a first type mounted on the hinge shaft and conductively attached to the hinge shaft, an electrical device of a second type, electrical insulating means to attach the electrical device of the second type to the hinge shaft, the electrical device of the first type including an electrically conductive lug for connecting the support hinge shaft to ground, contact means mounted on the shaft for electrically connecting at least one of the electrical conductors to the support shaft hinge, and the electrical device of the second type including an electrical component connected to at least one of said electrical conductors.

11. The improvement defined by claim 9 including pins projecting from each of said boards and positioned in spaced relation adjacent said hinge shaft for locating in relation to the tie clamp means the electrical conductors for interconnecting the conductive strips on said boards so that said interconnecting electrical conductors may be provided of a minimum length.

References Cited

UNITED STATES PATENTS 3,199,059 8/1965 Masse et al. ........... 339—4

ROBERT K. SCHAEFER, *Primary Examiner.*

M. GINSBURG, *Assistant Examiner.*